United States Patent
Patel et al.

(10) Patent No.: US 8,592,679 B2
(45) Date of Patent: *Nov. 26, 2013

(54) ELECTRONIC DEVICE MODULE COMPRISING POLYOLEFIN COPOLYMER

(71) Applicant: Dow Global Technologies LLC, Midland, MI (US)

(72) Inventors: Rajen M. Patel, Lake Jackson, TX (US); Shaofu Wu, Sugar Land, TX (US); Mark T. Bernius, Midland, MI (US); Mohamed Esseghir, Lawrenceville, NJ (US); Robert L. McGee, Midland, MI (US); Michael H. Mazor, Midland, MI (US); John A. Naumovitz, Midland, MI (US)

(73) Assignee: Dow Global Technologies, LLC, Midland, MI (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/667,744

(22) Filed: Nov. 2, 2012

(65) Prior Publication Data

US 2013/0118583 A1  May 16, 2013

Related U.S. Application Data

(63) Continuation of application No. 11/857,208, filed on Sep. 18, 2007.

(60) Provisional application No. 60/826,328, filed on Sep. 20, 2006, provisional application No. 60/865,965, filed on Nov. 15, 2006.

(51) Int. Cl.
 *H01L 31/042* (2006.01)
 *H02N 6/00* (2006.01)
 *H01L 31/00* (2006.01)

(52) U.S. Cl.
 USPC .............. 136/259; 136/251; 136/256

(58) Field of Classification Search
 USPC ................... 136/256, 259, 251–252
 See application file for complete search history.

(56) References Cited

U.S. PATENT DOCUMENTS 3,202,648 A  8/1965  Latourette et al.
3,236,917 A  2/1966  Natta et al.
(Continued)

FOREIGN PATENT DOCUMENTS

GB  1 535 039  12/1978
JP  50-140867 A  11/1975
(Continued)

OTHER PUBLICATIONS

Engage, 8100, Polyolefin Elastomer, the Dow Chemical Company.
(Continued)

*Primary Examiner* — Jonathan Johnson
*Assistant Examiner* — Lindsey Bernier

(57) ABSTRACT

An electronic device module comprising:
 A. At least one electronic device, e.g., a solar cell, and
 B. A polymeric material in intimate contact with at least one surface of the electronic device, the polymeric material comprising (1) a polyolefin copolymer with at least one of (a) a density of less than about 0.90 g/cc, (b) a 2% secant modulus of less than about 150 megaPascal (mPa) as measured by ASTM D-882-02), (c) a melt point of less than about 95 C, (d) an ∀-olefin content of at least about 15 and less than about 50 wt % based on the weight of the polymer, (e) a Tg of less than about −35 C, and (f) a SCBDI of at least about 50, (2) optionally, free radical initiator, e.g., a peroxide or azo compound, or a photoinitiator, e.g., benzophenone, and (3) optionally, a co-agent.

Typically, the polyolefin copolymer is an ethylene/∀-olefin copolymer. Optionally, the polymeric material can further comprise a vinyl silane and/or a scorch inhibitor, and the copolymer can remain uncrosslinked or be crosslinked.

18 Claims, 3 Drawing Sheets

(56) References Cited

U.S. PATENT DOCUMENTS

| | | |
|---|---|---|
| 3,335,124 A | 8/1967 | Larsen |
| 3,751,378 A | 8/1973 | Cowperthwaite et al. |
| 3,862,107 A | 1/1975 | MacLeay |
| 3,954,907 A | 5/1976 | Schober |
| 4,129,531 A | 12/1978 | Rauer et al. |
| 4,499,658 A * | 2/1985 | Lewis ............................ 438/64 |
| 4,632,950 A | 12/1986 | Kmiec et al. |
| 4,798,081 A | 1/1989 | Hazlitt et al. |
| 4,950,541 A | 8/1990 | Tabor et al. |
| 5,008,204 A | 4/1991 | Stehling |
| 5,032,459 A * | 7/1991 | Toyoshima et al. ........ 428/424.8 |
| 5,091,586 A | 2/1992 | Higuchi et al. |
| 5,194,509 A | 3/1993 | Hasenbein et al. |
| 5,246,783 A | 9/1993 | Spenadel et al. |
| 5,266,627 A | 11/1993 | Meverden et al. |
| 5,272,236 A | 12/1993 | Lai et al. |
| 5,278,272 A | 1/1994 | Lai et al. |
| 5,476,553 A | 12/1995 | Hanoka et al. |
| 5,741,370 A | 4/1998 | Hanoka |
| 5,762,720 A | 6/1998 | Hanoka et al. |
| 5,783,638 A | 7/1998 | Lai et al. |
| 5,986,028 A | 11/1999 | Lai et al. |
| 5,986,203 A | 11/1999 | Hanoka et al. |
| 6,077,907 A | 6/2000 | Raetzsch et al. |
| 6,093,757 A | 7/2000 | Pern |
| 6,114,046 A | 9/2000 | Hanoka |
| 6,320,116 B1 | 11/2001 | Hanoka |
| 6,353,042 B1 | 3/2002 | Hanoka et al. |
| 6,403,710 B1 | 6/2002 | Ahmed et al. |
| 6,479,590 B1 | 11/2002 | Ikeda et al. |
| 6,506,842 B1 | 1/2003 | Heck et al. |
| 6,524,702 B1 | 2/2003 | Betso et al. |
| 6,559,230 B2 * | 5/2003 | Heck et al. .................... 525/191 |
| 6,586,271 B2 | 7/2003 | Hanoka |
| 7,521,515 B2 | 4/2009 | Oi et al. |
| 7,847,021 B2 | 12/2010 | Shinoda et al. |
| 7,935,584 B2 | 5/2011 | Moriwaka et al. |
| 8,178,159 B2 | 5/2012 | Baikerikar et al. |
| 2001/0045229 A1 | 11/2001 | Komori et al. |
| 2002/0038664 A1 * | 4/2002 | Zenko et al. .................. 136/251 |
| 2003/0164497 A1 * | 9/2003 | Carcia et al. .................... 257/40 |
| 2004/0058162 A1 * | 3/2004 | Tukachinsky et al. ........ 428/422 |
| 2007/0160861 A1 | 7/2007 | Shinoda et al. |
| 2008/0078445 A1 * | 4/2008 | Patel et al. ..................... 136/256 |
| 2008/0283117 A1 | 11/2008 | Tsunomura |
| 2008/0302417 A1 | 12/2008 | Inoue et al. |

FOREIGN PATENT DOCUMENTS

| | | |
|---|---|---|
| JP | 01-244669 A | 9/1989 |
| JP | 6-299125 A | 10/1994 |
| JP | 2000-091611 A | 3/2000 |
| JP | 2000-15104 A | 5/2000 |
| JP | 200132637 | 2/2001 |
| JP | 2001044460 A | 2/2001 |
| JP | 2001119047 A | 4/2001 |
| JP | 2003138034 A | 5/2003 |

OTHER PUBLICATIONS

Wild, L, et al, Journal of Polymer Science: Polymer Physics Edition, vol. 20, 1982, pp. 441-455.

Kirk-Othmer, Encyclopedia of Chemical Technology, Third Edition, vol. 17, 1982. pp. 27-90.

Park, C.P., Handbook of Polymeric Foams and Foam Technology, 1991, pp. 198-204.

PCT/US2007/078846, International Search Report and the Written Opinion of the International Searching Authority.

Engage, DuPont Dow Elastomers Product Information, DuPont Dow Elastomers, Sep. 2001, pp. 1-6.

PCT/US2007/078846, International Preliminary Report on Patentability.

* cited by examiner

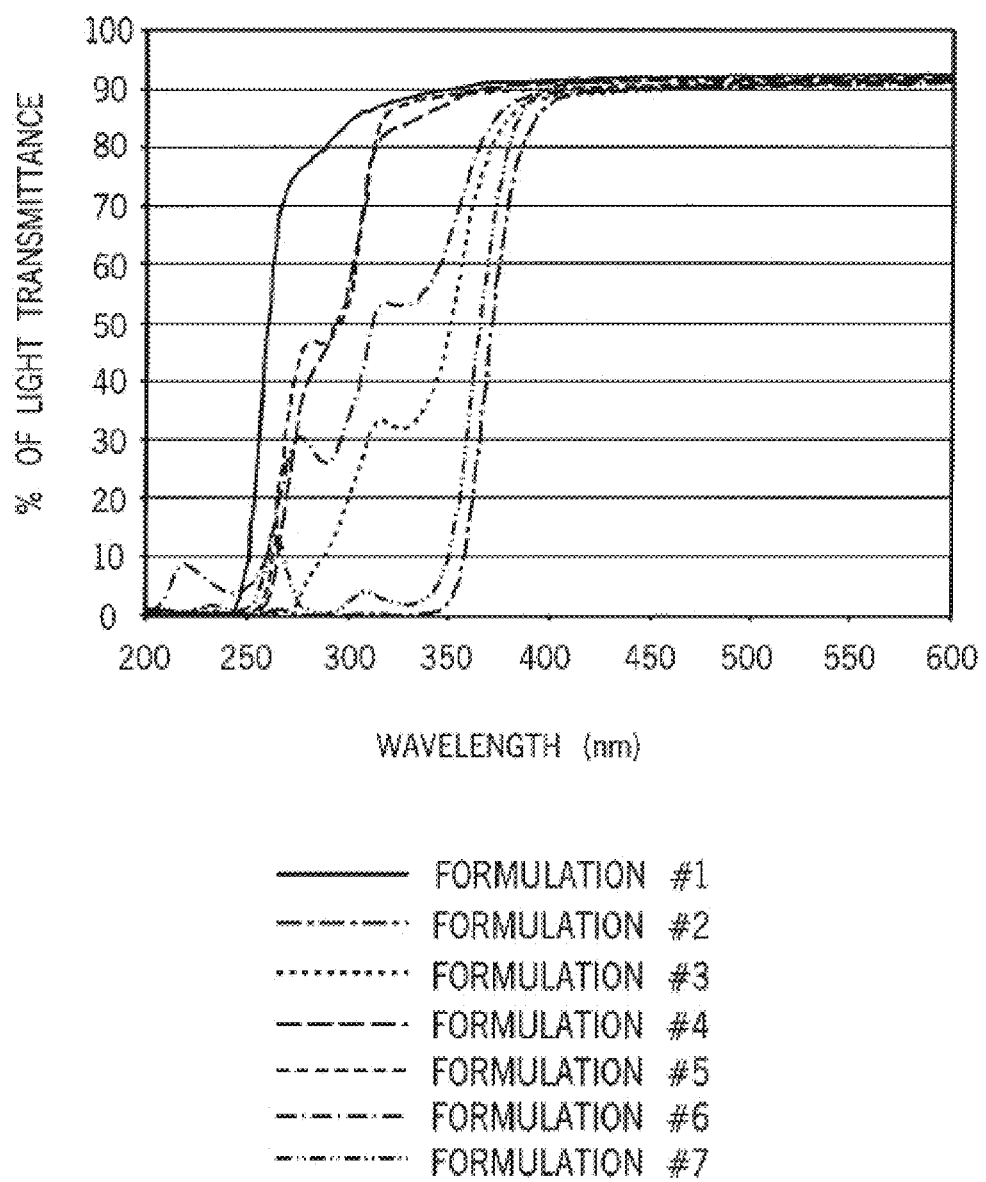

ELECTRONIC DEVICE MODULE COMPRISING POLYOLEFIN COPOLYMER

CROSS REFERENCE TO RELATED APPLICATION

The present application is a continuation application of the U.S. application Ser. No. 11/857,208, filed on Sep. 18, 2007, entitled "ELECTRONIC DEVICE MODULE COMPRISING POLYOLEFIN COPOLYMER," the teachings of which are incorporated by reference herein, as if reproduced in full hereinbelow, which claims priority from the U.S. Provisional Application No. 60/826,328, filed on Sep. 20, 2006, and from the U.S. Provisional Application No. 60/865,965, filed on Nov. 15, 2006, the teachings of which are incorporated by reference herein, as if reproduced in full hereinbelow.

FIELD OF THE INVENTION

This invention relates to electronic device modules. In one aspect, the invention relates to electronic device modules comprising an electronic device, e.g., a solar or photovoltaic (PV) cell, and a protective polymeric material while in another aspect, the invention relates to electronic device modules in which the protective polymeric material is a polyolefin polymer with at least one of (a) a density of less than about 0.90 grams per cubic centimeter (g/cc), (b) a low modulus, (c) a melt point less than about 95 C, (d) an $\forall$-olefin content between about 15-50 weight percent (wt %) based on the weight of the copolymer, (e) a glass transition temperature (Tg) of less than about −35 C, and (f) a short chain branch distribution index (SCBDI or CDBI) of 50 or greater. In yet another aspect, the invention relates to a method of making an electronic device module.

BACKGROUND OF THE INVENTION

Polymeric materials are commonly used in the manufacture of modules comprising one or more electronic devices including, but not limited to, solar cells (also known as photovoltaic cells), liquid crystal panels, electro-luminescent devices and plasma display units. The modules often comprise an electronic device in combination with one or more substrates, e.g., one or more glass cover sheets, often positioned between two substrates in which one or both of the substrates comprise glass, metal, plastic, rubber or another material. The polymeric materials are typically used as the encapsulant or sealant for the module or depending upon the design of the module, as a skin layer component of the module, e.g., a backskin in a solar cell module. Typical polymeric materials for these purposes include silicone resins, epoxy resins, polyvinyl butyral resins, cellulose acetate, ethylene-vinyl acetate copolymer (EVA) and ionomers.

United States Patent Application Publication 2001/0045229 A1 identifies a number of properties desirable in any polymeric material that is intended for use in the construction of an electronic device module. These properties include (i) protecting the device from exposure to the outside environment, e.g., moisture and air, particularly over long periods of time (ii) protecting against mechanical shock, (iii) strong adhesion to the electronic device and substrates, (iv) easy processing, including sealing, (v) good transparency, particularly in applications in which light or other electromagnetic radiation is important, e.g., solar cell modules, (vi) short cure times with protection of the electronic device from mechanical stress resulting from polymer shrinkage during cure, (vii) high electrical resistance with little, if any, electrical conductance, and (viii) low cost. No one polymeric material delivers maximum performance on all of these properties in any particular application, and usually trade-offs are made to maximize the performance of properties most important to a particular application, e.g., transparency and protection against the environment, at the expense of properties secondary in importance to the application, e.g., cure time and cost. Combinations of polymeric materials are also employed, either as a blend or as separate components of the module.

EVA copolymers with a high content (28 to 35 wt %) of units derived from the vinyl acetate monomer are commonly used to make encapsulant film for use in photovoltaic (PV) modules. See, for example, WO 95/22844, 99/04971, 99/05206 and 2004/055908. EVA resins are typically stabilized with ultra-violet (UV) light additives, and they are typically crosslinked during the solar cell lamination process using peroxides to improve heat and creep resistance to a temperature between about 80 and 90 C. However, EVA resins are less than ideal PV cell encapsulating film material for several reasons. For example, EVA film progressively darkens in intense sunlight due to the EVA resin chemically degrading under the influence of UV light. This discoloration can result in a greater than 30% loss in power output of the solar module after as little as four years of exposure to the environment. EVA resins also absorb moisture and are subject to decomposition.

Moreover and as noted above, EVA resins are typically stabilized with UV additives and crosslinked during the solar cell lamination and/or encapsulation process using peroxides to improve heat resistance and creep at high temperature, e.g., 80 to 90° C. However, because of the C=O bonds in the EVA molecular structure that absorbs UV radiation and the presence of residual peroxide crosslinking agent in the system after curing, an additive package is used to stabilize the EVA against UV-induced degradation. The residual peroxide is believed to be the primary oxidizing reagent responsible for the generation of chromophores (e.g., U.S. Pat. No. 6,093,757). Additives such as antioxidants, UV-stabilizers, UV-absorbers and others are can stabilize the EVA, but at the same time the additive package can also block UV-wavelengths below 360 nanometers (nm).

Photovoltaic module efficiency depends on photovoltaic cell efficiency and the sun light wavelength passing through the encapsulant. One of the most fundamental limitations on the efficiency of a solar cell is the band gap of its semi-conducting material, i.e., the energy required to boost an electron from the bound valence band into the mobile conduction band. Photons with less energy than the band gap pass through the module without being absorbed. Photons with energy higher than the band gap are absorbed, but their excess energy is wasted (dissipated as heat). In order to increase the photovoltaic cell efficiency, "tandem" cells or multi-junction cells are used to broaden the wavelength range for energy conversion. In addition, in many of the thin film technologies such as amorphous silicon, cadmium telluride, or copper indium gallium selenide, the band gap of the semi-conductive materials is different than that of mono-crystalline silicon. These photovoltaic cells will convert light into electricity for wavelength below 360 nm. For these photovoltaic cells, an encapsulant that can absorb wavelengths below 360 nm is needed to maintain the PV module efficiency.

U.S. Pat. Nos. 6,320,116 and 6,586,271 teach another important property of these polymeric materials, particularly those materials used in the construction of solar cell modules. This property is thermal creep resistance, i.e., resistance to the permanent deformation of a polymer over a period of time as a result of temperature. Thermal creep resistance, generally, is directly proportional to the melting temperature of a polymer. Solar cell modules designed for use in architectural application often need to show excellent resistance to thermal creep at temperatures of 90 C or higher. For materials with low melting temperatures, e.g., EVA, crosslinking the polymeric material is often necessary to give it higher thermal creep resistance.

Crosslinking, particularly chemical crosslinking, while addressing one problem, e.g., thermal creep, can create other problems. For example, EVA, a common polymeric material used in the construction of solar cell modules and which has a rather low melting point, is often crosslinked using an organic peroxide initiator. While this addresses the thermal creep problem, it creates a corrosion problem, i.e., total crosslinking is seldom, if ever, fully achieved and this leaves residual peroxide in the EVA. This remaining peroxide can promote oxidation and degradation of the EVA polymer and/or electronic device, e.g., through the release of acetic acid over the life of the electronic device module. Moreover, the addition of organic peroxide to EVA requires careful temperature control to avoid premature crosslinking.

Another potential problem with peroxide-initiated crosslinking is the buildup of crosslinked material on the metal surfaces of the process equipment. During extrusion runs, high residence time is experienced at all metal flow surfaces. Over longer periods of extrusion time, crosslinked material can form at the metal surfaces and require cleaning of the equipment. The current practice to minimize gel formation, i.e., this crosslinking of polymer on the metal surfaces of the processing equipment, is to use low processing temperatures which, in turn, reduces the production rate of the extruded product.

One other property that can be important in the selection of a polymeric material for use in the manufacture of an electronic device module is thermoplasticity, i.e., the ability to be softened, molded and formed. For example, if the polymeric material is to be used as a backskin layer in a frameless module, then it should exhibit thermoplasticity during lamination as described in U.S. Pat. No. 5,741,370. This thermoplasticity, however, must not be obtained at the expense of effective thermal creep resistance.

SUMMARY OF THE INVENTION

In one embodiment, the invention is an electronic device module comprising:
A. At least one electronic device, and
B. A polymeric material in intimate contact with at least one surface of the electronic device, the polymeric material comprising (1) a polyolefin copolymer with at least one of (a) a density of less than about 0.90 g/cc, (b) a 2% secant modulus of less than about 150 megaPascal (mPa) as measured by ASTM D-882-02), (c) a melt point of less than about 95 C, (d) an ∀-olefin content of at least about 15 and less than about 50 wt % based on the weight of the polymer, (e) a Tg of less than about −35 C, and (f) a SCBDI of at least about 50, (2) optionally, free radical initiator, e.g., a peroxide or azo compound, or a photoinitiator, e.g., benzophenone, in an amount of at least about 0.05 wt % based on the weight of the copolymer, and (3) optionally, a co-agent in an amount of at least about 0.05 wt % based upon the weight of the copolymer.

In another embodiment, the invention is an electronic device module comprising:
A. At least one electronic device, and
B. A polymeric material in intimate contact with at least one surface of the electronic device, the polymeric material comprising (1) a polyolefin copolymer with at least one of (a) a density of less than about 0.90 g/cc, (b) a 2% secant modulus of less than about 150 megaPascal (mPa) as measured by ASTM D-882-02), (c) a melt point of less than about 95 C, (d) an ∀-olefin content of at least about 15 and less than about 50 wt % based on the weight of the polymer, (e) a Tg of less than about −35 C, and (f) a SCBDI of at least about 50, (2) a vinyl silane, e.g., vinyl tri-ethoxy silane or vinyl tri-methoxy silane, in an amount of at least about 0.1 wt % based on the weight of the copolymer, (3) free radical initiator, e.g., a peroxide or azo compound, or a photoinitiator, e.g., benzophenone, in an amount of at least about 0.05 wt % based on the weight of the copolymer, and (4) optionally, a co-agent in an amount of at least about 0.05 wt % based on the weight of the copolymer.

"In intimate contact" and like terms mean that the polymeric material is in contact with at least one surface of the device or other article in a similar manner as a coating is in contact with a substrate, e.g., little, if any gaps or spaces between the polymeric material and the face of the device and with the material exhibiting good to excellent adhesion to the face of the device. After extrusion or other method of applying the polymeric material to at least one surface of the electronic device, the material typically forms and/or cures to a film that can be either transparent or opaque and either flexible or rigid. If the electronic device is a solar cell or other device that requires unobstructed or minimally obstructed access to sunlight or to allow a user to read information from it, e.g., a plasma display unit, then that part of the material that covers the active or "business" surface of the device is highly transparent.

The module can further comprise one or more other components, such as one or more glass cover sheets, and in these embodiments, the polymeric material usually is located between the electronic device and the glass cover sheet in a sandwich configuration. If the polymeric material is applied as a film to the surface of the glass cover sheet opposite the electronic device, then the surface of the film that is in contact with that surface of the glass cover sheet can be smooth or uneven, e.g., embossed or textured.

Typically, the polyolefin copolymer is an ethylene/∀-olefin copolymer. The polymeric material can fully encapsulate the electronic device, or it can be in intimate contact with only a portion of it, e.g., laminated to one face surface of the device. Optionally, the polymeric material can further comprise a scorch inhibitor, and depending upon the application for which the module is intended, the chemical composition of the copolymer and other factors, the copolymer can remain uncrosslinked or be crosslinked. If crosslinked, then it is crosslinked such that it contains less than about 70 percent xylene soluble extractables as measured by ASTM 2765-95.

In another embodiment, the invention is the electronic device module as described in the two embodiments above except that the polymeric material in intimate contact with at least one surface of the electronic device is a co-extruded material in which at least one outer skin layer (i) does not contain peroxide for crosslinking, and (ii) is the surface which comes into intimate contact with the module. Typically, this outer skin layer exhibits good adhesion to glass. This outer skin of the co-extruded material can comprise any one of a number of different polymers, but is typically the same polymer as the polymer of the peroxide-containing layer but without the peroxide. This embodiment of the invention allows for the use of higher processing temperatures which, in turn, allows for faster production rates without unwanted gel formation in the encapsulating polymer due to extended contact with the metal surfaces of the processing equipment. In another embodiment, the extruded product comprises at least three layers in which the skin layer in contact with the electronic module is without peroxide, and the peroxide-containing layer is a core layer.

In another embodiment, the invention is a method of manufacturing an electronic device module, the method comprising the steps of:

A. Providing at least one electronic device, and
B. Contacting at least one surface of the electronic device with a polymeric material comprising (1) a polyolefin copolymer with at least one of (a) a density of less than about 0.90 g/cc, (b) a 2% secant modulus of less than about 150 megaPascal (mPa) as measured by ASTM D-882-02), (c) a melt point of less than about 95 C, (d) an ∀-olefin content of at least about 15 and less than about 50 wt % based on the weight of the polymer, (e) a Tg of less than about −35 C, and (f) a SCBDI of at least about 50, (2) optionally, free radical initiator, e.g., a peroxide or azo compound, or a photoinitiator, e.g., benzophenone, in an amount of at least about 0.05 wt % based on the weight of the copolymer, and (3) optionally, a co-agent in an amount of at least about 0.05 wt % based upon the weight of the copolymer.

In another embodiment the invention is a method of manufacturing an electronic device, the method comprising the steps of:

A. Providing at least one electronic device, and
B. Contacting at least one surface of the electronic device with a polymeric material comprising (1) a polyolefin copolymer with at least one of (a) a density of less than about 0.90 g/cc, (b) a 2% secant modulus of less than about 150 megaPascal (mPa) as measured by ASTM D-882-02), (c) a melt point of less than about 95 C, (d) an ∀-olefin content of at least about 15 and less than about 50 wt % based on the weight of the polymer, (e) a Tg of less than about −35 C, and (f) a SCBDI of at least about 50, (2) a vinyl silane, e.g., vinyl tri-ethoxy silane or vinyl tri-methoxy silane, in an amount of at least about 0.1 wt % based on the weight of the copolymer, (3) free radical initiator, e.g., a peroxide or azo compound, or a photoinitiator, e.g., benzophenone, in an amount of at least about 0.05 wt % based on the weight of the copolymer, and (4) optionally, a co-agent in an amount of at least about 0.05 wt % based on the weight of the copolymer.

In a variant on both of these two method embodiments, the module further comprises at least one translucent cover layer disposed apart from one face surface of the device, and the polymeric material is interposed in a sealing relationship between the electronic device and the cover layer. "In a sealing relationship" and like terms mean that the polymeric material adheres well to both the cover layer and the electronic device, typically to at least one face surface of each, and that it binds the two together with little, if any, gaps or spaces between the two module components (other than any gaps or spaces that may exist between the polymeric material and the cover layer as a result of the polymeric material applied to the cover layer in the form of an embossed or textured film, or the cover layer itself is embossed or textured).

Moreover, in both of these method embodiments, the polymeric material can further comprise a scorch inhibitor, and the method can optionally include a step in which the copolymer is crosslinked, e.g., either contacting the electronic device and/or glass cover sheet with the polymeric material under crosslinking conditions, or exposing the module to crosslinking conditions after the module is formed such that the polyolefin copolymer contains less than about 70 percent xylene soluble extractables as measured by ASTM 2765-95. Crosslinking conditions include heat (e.g., a temperature of at least about 160 C), radiation (e.g., at least about 15 mega-rad if by E-beam, or 0.05 joules/cm$^2$ if by UV light), moisture (e.g., a relative humidity of at least about 50%), etc.

In another variant on these method embodiments, the electronic device is encapsulated, i.e., fully engulfed or enclosed, within the polymeric material. In another variant on these embodiments, the glass cover sheet is treated with a silane coupling agent, e.g., (-amino propyl tri-ethoxy silane. In yet another variant on these embodiments, the polymeric material further comprises a graft polymer to enhance its adhesive property relative to the one or both of the electronic device and glass cover sheet. Typically the graft polymer is made in situ simply by grafting the polyolefin copolymer with an unsaturated organic compound that contains a carbonyl group, e.g., maleic anhydride.

In another embodiment, the invention is an ethylene/nonpolar α-olefin polymeric film characterized in that the film has (i) greater than or equal to (≥) 92% transmittance over the wavelength range from 400 to 1100 nanometers (nm), and (ii) a water vapor transmission rate (WVTR) of less than (<) about 50, preferably <about 15, grams per square meter per day (g/m$^2$-day) at 38 C and 100% relative humidity (RH).

BRIEF DESCRIPTION OF THE DRAWINGS

FIG. 4 is UV spectrum of the samples prepared and reported in Example 6.

DESCRIPTION OF THE PREFERRED EMBODIMENTS

Figure 1:
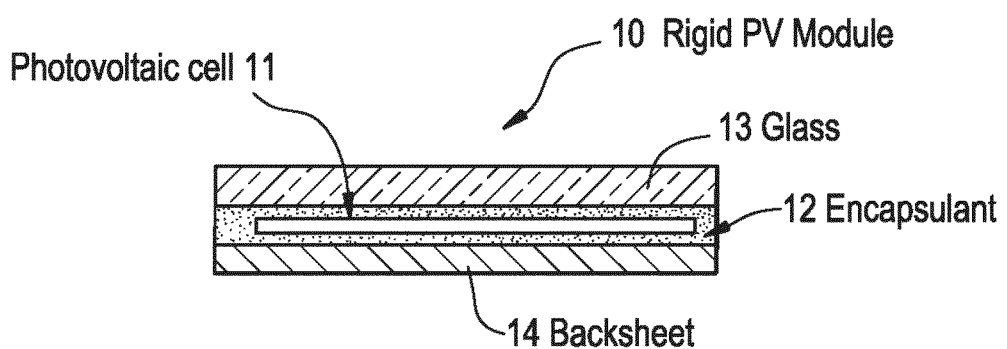
FIG. 1 is a schematic of one embodiment of an electronic device module of this invention, i.e., a rigid photovoltaic (PV) module.

The polyolefin copolymers useful in the practice of this invention have a density of less than about 0.90, preferably less than about 0.89, more preferably less than about 0.885, even more preferably less than about 0.88 and even more preferably less than about 0.875, g/cc. The polyolefin copolymers typically have a density greater than about 0.85, and more preferably greater than about 0.86, g/cc. Density is measured by the procedure of ASTM D-792. Low density polyolefin copolymers are generally characterized as amorphous, flexible and having good optical properties, e.g., high transmission of visible and UV-light and low haze.

The polyolefin copolymers useful in the practice of this invention have a 2% secant modulus of less than about 150, preferably less than about 140, more preferably less than about 120 and even more preferably less than about 100, mPa as measured by the procedure of ASTM D-882-02. The polyolefin copolymers typically have a 2% secant modulus of greater than zero, but the lower the modulus, the better the copolymer is adapted for use in this invention. The secant modulus is the slope of a line from the origin of a stress-strain diagram and intersecting the curve at a point of interest, and it is used to describe the stiffness of a material in the inelastic region of the diagram. Low modulus polyolefin copolymers are particularly well adapted for use in this invention because they provide stability under stress, e.g., less prone to crack upon stress or shrinkage.

The polyolefin copolymers useful in the practice of this invention and that are made with a single site catalyst such as a metallocene catalyst or constrained geometry catalyst, typically have a melting point of less than about 95, preferably less than about 90, more preferably less than about 85, even more preferably less than about 80 and still more preferably less than about 75, C. For polyolefin copolymers made with multi-site catalysts, e.g., Ziegler-Natta and Phillips catalysts, the melting point is typically less than about 125, preferably less than about 120, more preferably less than about 115 and even more preferably less than about 110, C. The melting point is measured by differential scanning calorimetry (DSC) as described, for example, in U.S. Pat. No. 5,783,638. Polyolefin copolymers with a low melting point often exhibit desirable flexibility and thermoplasticity properties useful in the fabrication of the modules of this invention.

The polyolefin copolymers useful in the practice of this invention include ethylene/∀-olefin interpolymers having a ∀-olefin content of between about 15, preferably at least about 20 and even more preferably at least about 25, wt % based on the weight of the interpolymer. These interpolymers typically have an ∀-olefin content of less than about 50, preferably less than about 45, more preferably less than about 40 and even more preferably less than about 35, wt % based on the weight of the interpolymer. The ∀-olefin content is measured by $^{13}C$ nuclear magnetic resonance (NMR) spectroscopy using the procedure described in Randall (*Rev. Macromol. Chem. Phys.*, C29 (2&3)). Generally, the greater the ∀-olefin content of the interpolymer, the lower the density and the more amorphous the interpolymer, and this translates into desirable physical and chemical properties for the protective polymer component of the module.

The ∀-olefin is preferably a $C_{3-20}$ linear, branched or cyclic ∀-olefin. The term interpolymer refers to a polymer made from at least two monomers. It includes, for example, copolymers, terpolymers and tetrapolymers. Examples of $C_{3-20}$ ∀-olefins include propene, 1-butene, 4-methyl-1-pentene, 1-hexene, 1-octene, 1-decene, 1-dodecene, 1-tetradecene, 1-hexadecene, and 1-octadecene. The ∀-olefins can also contain a cyclic structure such as cyclohexane or cyclopentane, resulting in an ∀-olefin such as 3-cyclohexyl-1-propene (allyl cyclohexane) and vinyl cyclohexane. Although not ∀-olefins in the classical sense of the term, for purposes of this invention certain cyclic olefins, such as norbornene and related olefins, are ∀-olefins and can be used in place of some or all of the ∀-olefins described above. Similarly, styrene and its related olefins (for example, ∀-methylstyrene, etc.) are ∀-olefins for purposes of this invention. Acrylic and methacrylic acid and their respective ionomers, and acrylates and methacrylates, however, are not ∀-olefins for purposes of this invention. Illustrative polyolefin copolymers include ethylene/propylene, ethylene/butene, ethylene/1-hexene, ethylene/1-octene, ethylene/styrene, and the like. Ethylene/acrylic acid (EAA), ethylene/methacrylic acid (EMA), ethylene/acrylate or methacrylate, ethylene/vinyl acetate and the like are not polyolefin copolymers of this invention. Illustrative terpolymers include ethylene/propylene/1-octene, ethylene/prop ylene/butene, ethylene/butene/1-octene, and ethylene/butene/styrene. The copolymers can be random or blocky.

More specific examples of olefinic interpolymers useful in this invention include very low density polyethylene (VLDPE) (e.g., FLEXOMER® ethylene/1-hexene polyethylene made by The Dow Chemical Company), homogeneously branched, linear ethylene/∀-olefin copolymers (e.g. TAFMER® by Mitsui Petrochemicals Company Limited and EXACT® by Exxon Chemical Company), and homogeneously branched, substantially linear ethylene/V-olefin polymers (e.g., AFFINITY® and ENGAGE® polyethylene available from The Dow Chemical Company). The more preferred polyolefin copolymers are the homogeneously branched linear and substantially linear ethylene copolymers. The substantially linear ethylene copolymers are especially preferred, and are more fully described in U.S. Pat. Nos. 5,272,236, 5,278,272 and 5,986,028.

The polyolefin copolymers useful in the practice of this invention also include propylene, butene and other alkene-based copolymers, e.g., copolymers comprising a majority of units derived from propylene and a minority of units derived from another ∀-olefin (including ethylene). Exemplary polypropylenes useful in the practice of this invention include the VERSIFY® polymers available from The Dow Chemical Company, and the VISTAMAXX® polymers available from ExxonMobil Chemical Company.

Blends of any of the above olefinic interpolymers can also be used in this invention, and the polyolefin copolymers can be blended or diluted with one or more other polymers to the extent that the polymers are (i) miscible with one another, (ii) the other polymers have little, if any, impact on the desirable properties of the polyolefin copolymer, e.g., optics and low modulus, and (iii) the polyolefin copolymers of this invention constitute at least about 70, preferably at least about 75 and more preferably at least about 80, weight percent of the blend. Although not favored, EVA copolymer can be one of the diluting polymers.

The polyolefin copolymers useful in the practice of this invention have a Tg of less than about −35, preferably less than about −40, more preferably less than about −45 and even more preferably less than about −50, C as measured by differential scanning calorimetry (DSC) using the procedure of ASTM D-3418-03. Moreover, typically the polyolefin copolymers used in the practice of this invention also have a melt index (MI as measured by the procedure of ASTM D-1238 (190 C/2.16 kg) of less than about 100, preferably less than about 75, more preferably less than about 50 and even more preferably less than about 35, g/10 minutes. The typical minimum MI is about 1, and more typically it is about 5.

The polyolefin copolymers useful in the practice of this invention have an SCBDI (Short Chain Branch Distribution Index) or CDBI (Composition Distribution Branch Index) is defined as the weight percent of the polymer molecules having comonomer content within 50 percent of the median total molar comonomer content. The CDBI of a polymer is readily calculated from data obtained from techniques known in the art, such as, for example, temperature rising elution fractionation (abbreviated herein as "TREF") as described, for example, in Wild et al, *Journal of Polymer Science*, Poly. Phys. Ed., Vol. 20, p. 441 (1982), or as described in U.S. Pat. Nos. 4,798,081 and 5,008,204. The SCBDI or CDBI for the polyolefin copolymers used in the practice of this present invention is typically greater than about 50, preferably greater than about 60, more preferably greater than about 70, even more preferably greater than about 80, and most preferably greater than about 90 percent.

The polymeric material used in the practice of this invention has at least one, preferably at least two, more preferably at least three, even more preferably at least four and still more preferably at least five, of the following properties: (a) a density of less than about 0.90 g/cc, (b) a 2% secant modulus of less than about 150 megaPascal (mPa) as measured by ASTM D-882-02), (c) a melt point of less than about 95 C, (d) an ∀-olefin content of at least about 15 and less than about 50 wt % based on the weight of the polymer, (e) a Tg of less than about −35 C, and (f) a SCBDI of at least about 50. Preferably, the polyolefin copolymers used in the practice of this invention have at least the (a) and (b) properties, more preferably at least the (a), (b) and (c) properties, even more preferably at least the (a), (b), (c) and (d) properties, and still more preferably at least the (a), (b), (c), (d) and (e) properties. Preferred polyolefin polymers are the Affinity® and Engage® polyethylene of The Dow Chemical Company.

Due to the low density and modulus of the polyolefin copolymers used in the practice of this invention, these copolymers are typically cured or crosslinked at the time of contact or after, usually shortly after, the module has been constructed. Crosslinking is important to the performance of the copolymer in its function to protect the electronic device from the environment. Specifically, crosslinking enhances the thermal creep resistance of the copolymer and durability of the module in terms of heat, impact and solvent resistance. Crosslinking can be effected by any one of a number of different methods, e.g., by the use of thermally activated initiators, e.g., peroxides and azo compounds; photoinitiators, e.g., benzophenone; radiation techniques including sunlight, UV light, E-beam and x-ray; vinyl silane, e.g., vinyl tri-ethoxy or vinyl tri-methoxy silane; and moisture cure.

The free radical initiators used in the practice of this invention include any thermally activated compound that is relatively unstable and easily breaks into at least two radicals. Representative of this class of compounds are the peroxides, particularly the organic peroxides, and the azo initiators. Of the free radical initiators used as crosslinking agents, the dialkyl peroxides and diperoxyketal initiators are preferred. These compounds are described in the Encyclopedia of Chemical Technology, 3rd edition, Vol. 17, pp 27-90. (1982).

In the group of dialkyl peroxides, the preferred initiators are: dicumyl peroxide, di-t-butyl peroxide, t-butyl cumyl peroxide, 2,5-dimethyl-2,5-di(t-butylperoxy)-hexane, 2,5-dimethyl-2,5-di(t-amylperoxy)-hexane, 2,5-dimethyl-2,5-di(t-butylperoxy)hexyne-3, 2,5-dimethyl-2,5-di(t-amylperoxy) hexyne-3, ∀,∀-di[(t-butylperoxy)-isopropyl]-benzene, di-t-amyl peroxide, 1,3,5-tri-[(t-butylperoxy)-isopropyl]benzene, 1,3-dimethyl-3-(t-butylperoxy)butanol, 1,3-dimethyl-3-(t-amylperoxy)butanol and mixtures of two or more of these initiators.

In the group of diperoxyketal initiators, the preferred initiators are: 1,1-di(t-butylperoxy)-3,3,5-trimethylcyclohexane, 1,1-di(t-butylperoxy)cyclohexane n-butyl, 4,4-di(t-amylperoxy)valerate, ethyl 3,3-di(t-butylperoxy)butyrate, 2,2-di(t-amylperoxy)propane, 3,6,6,9,9-pentamethyl-3-ethoxycarbonylmethyl-1,2,4,5-tetraoxacyclononane, n-butyl-4,4-bis(t-butylperoxy)-valerate, ethyl-3,3-di(t-amylperoxy)-butyrate and mixtures of two or more of these initiators.

Other peroxide initiators, e.g., 00-t-butyl-0-hydrogen-monoperoxysuccinate; 00-t-amyl-0-hydrogen-monoperoxysuccinate and/or azo initiators e.g., 2,2'-azobis-(2-acetoxypropane), may also be used to provide a crosslinked polymer matrix. Other suitable azo compounds include those described in U.S. Pat. Nos. 3,862,107 and 4,129,531. Mixtures of two or more free radical initiators may also be used together as the initiator within the scope of this invention. In addition, free radicals can form from shear energy, heat or radiation.

The amount of peroxide or azo initiator present in the crosslinkable compositions of this invention can vary widely, but the minimum amount is that sufficient to afford the desired range of crosslinking. The minimum amount of initiator is typically at least about 0.05, preferably at least about 0.1 and more preferably at least about 0.25, wt % based upon the weight of the polymer or polymers to be crosslinked. The maximum amount of initiator used in these compositions can vary widely, and it is typically determined by such factors as cost, efficiency and degree of desired crosslinking desired. The maximum amount is typically less than about 10, preferably less than about 5 and more preferably less than about 3, wt % based upon the weight of the polymer or polymers to be crosslinked.

Free radical crosslinking initiation via electromagnetic radiation, e.g., sunlight, ultraviolet (UV) light, infrared (IR) radiation, electron beam, beta-ray, gamma-ray, x-ray and neutron rays, may also be employed. Radiation is believed to affect crosslinking by generating polymer radicals, which may combine and crosslink. The Handbook of Polymer Foams and Technology, supra, at pp. 198-204, provides additional teachings. Elemental sulfur may be used as a crosslinking agent for diene containing polymers such as EPDM and polybutadiene. The amount of radiation used to cure the copolymer will vary with the chemical composition of the copolymer, the composition and amount of initiator, if any, the nature of the radiation, and the like, but a typical amount of UV light is at least about 0.05, more typically at about 0.1 and even more typically at least about 0.5, Joules/cm$^2$, and a typical amount of E-beam radiation is at least about 0.5, more typically at least about 1 and even more typically at least about 1.5, megarads.

If sunlight or UV light is used to effect cure or crosslinking, then typically and preferably one or more photoinitiators are employed. Such photoinitiators include organic carbonyl compounds such as such as benzophenone, benzanthrone, benzoin and alkyl ethers thereof, 2,2-diethoxyacetophenone, 2,2-dimethoxy, 2 phenylacetophenone, p-phenoxy dichloroacetophenone, 2-hydroxycyclohexylphenone, 2-hydroxyisopropylphenone, and 1-phenylpropanedione-2-(ethoxy carboxyl) oxime. These initiators are used in known manners and in known quantities, e.g., typically at least about 0.05, more typically at least about 0.1 and even more typically about 0.5, wt % based on the weight of the copolymer.

If moisture, i.e., water, is used to effect cure or crosslinking, then typically and preferably one or more hydrolysis/condensation catalysts are employed. Such catalysts include Lewis acids such as dibutyltin dilaurate, dioctyltin dilaurate, stannous octonoate, and hydrogen sulfonates such as sulfonic acid.

Free radical crosslinking coagents, i.e. promoters or co-initiators, include multifunctional vinyl monomers and polymers, triallyl cyanurate and trimethylolpropane trimethacrylate, divinyl benzene, acrylates and methacrylates of polyols, allyl alcohol derivatives, and low molecular weight polybutadiene. Sulfur crosslinking promoters include benzothiazyl disulfide, 2-mercaptobenzothiazole, copper dimethyldithiocarbamate, dipentamethylene thiuram tetrasulfide, tetrabutylthiuram disulfide, tetramethylthiuram disulfide and tetramethylthiuram monosulfide.

These coagents are used in known amounts and known ways. The minimum amount of coagent is typically at least about 0.05, preferably at least about 0.1 and more preferably at least about 0.5, wt % based upon the weight of the polymer or polymers to be crosslinked. The maximum amount of coagent used in these compositions can vary widely, and it is typically determined by such factors as cost, efficiency and degree of desired crosslinking desired. The maximum amount is typically less than about 10, preferably less than about 5 and more preferably less than about 3, wt % based upon the weight of the polymer or polymers to be crosslinked.

One difficulty in using thermally activated free radical initiators to promote crosslinking, i.e., curing, of thermoplastic materials is that they may initiate premature crosslinking, i.e., scorch, during compounding and/or processing prior to the actual phase in the overall process in which curing is desired. With conventional methods of compounding, such as milling, Banbury, or extrusion, scorch occurs when the time-temperature relationship results in a condition in which the free radical initiator undergoes thermal decomposition which, in turn, initiates a crosslinking reaction that can create gel particles in the mass of the compounded polymer. These gel particles can adversely impact the homogeneity of the final product. Moreover, excessive scorch can so reduce the plastic properties of the material that it cannot be efficiently processed with the likely possibility that the entire batch will be lost.

One method of minimizing scorch is the incorporation of scorch inhibitors into the compositions. For example, British patent 1,535,039 discloses the use of organic hydroperoxides as scorch inhibitors for peroxide-cured ethylene polymer compositions. U.S. Pat. No. 3,751,378 discloses the use of N-nitroso diphenylamine or N,N'-dinitroso-para-phenylamine as scorch retardants incorporated into a polyfunctional acrylate crosslinking monomer for providing long Mooney scorch times in various copolymer formulations. U.S. Pat. No. 3,202,648 discloses the use of nitrites such as isoamyl nitrite, tert-decyl nitrite and others as scorch inhibitors for polyethylene. U.S. Pat. No. 3,954,907 discloses the use of monomeric vinyl compounds as protection against scorch. U.S. Pat. No. 3,335,124 describes the use of aromatic amines, phenolic compounds, mercaptothiazole compounds, bis(N,N-disubstituted-thiocarbamoyl) sulfides, hydroquinones and dialkyldithiocarbamate compounds. U.S. Pat. No. 4,632,950 discloses the use of mixtures of two metal salts of disubstituted dithiocarbamic acid in which one metal salt is based on copper.

One commonly used scorch inhibitor for use in free radical, particularly peroxide, initiator-containing compositions is 4-hydroxy-2,2,6,6-tetramethylpiperidin-1-oxyl also known as nitroxyl 2, or NR1, or 4-oxypiperidol, or tanol, or tempol, or tmpn, or probably most commonly, 4-hydroxy-TEMPO or even more simply, h-TEMPO. The addition of 4-hydroxy-TEMPO minimizes scorch by "quenching" free radical crosslinking of the crosslinkable polymer at melt processing temperatures.

The preferred amount of scorch inhibitor used in the compositions of this invention will vary with the amount and nature of the other components of the composition, particularly the free radical initiator, but typically the minimum amount of scorch inhibitor used in a system of polyolefin copolymer with 1.7 weight percent (wt %) peroxide is at least about 0.01, preferably at least about 0.05, more preferably at least about 0.1 and most preferably at least about 0.15, wt % based on the weight of the polymer. The maximum amount of scorch inhibitor can vary widely, and it is more a function of cost and efficiency than anything else. The typical maximum amount of scorch inhibitor used in a system of polyolefin copolymer with 1.7 wt % peroxide does not exceed about 2, preferably does not exceed about 1.5 and more preferably does not exceed about 1, wt % based on the weight of the copolymer.

Any silane that will effectively graft to and crosslink the polyolefin copolymer can be used in the practice of this invention. Suitable silanes include unsaturated silanes that comprise an ethylenically unsaturated hydrocarbyl group, such as a vinyl, allyl, isopropenyl, butenyl, cyclohexenyl or (-(meth)acryloxy allyl group, and a hydrolyzable group, such as, for example, a hydrocarbyloxy, hydrocarbonyloxy, or hydrocarbylamino group. Examples of hydrolyzable groups include methoxy, ethoxy, formyloxy, acetoxy, proprionyloxy, and alkyl or arylamino groups. Preferred silanes are the unsaturated alkoxy silanes which can be grafted onto the polymer. These silanes and their method of preparation are more fully described in U.S. Pat. No. 5,266,627. Vinyl trimethoxy silane, vinyl triethoxy silane, (-(meth)acryloxy propyl trimethoxy silane and mixtures of these silanes are the preferred silane crosslinkers for is use in this invention. If filler is present, then preferably the crosslinker includes vinyl triethoxy silane.

The amount of silane crosslinker used in the practice of this invention can vary widely depending upon the nature of the polyolefin copolymer, the silane, the processing conditions, the grafting efficiency, the ultimate application, and similar factors, but typically at least 0.5, preferably at least 0.7, parts per hundred resin wt % is used based on the weight of the copolymer. Considerations of convenience and economy are usually the two principal limitations on the maximum amount of silane crosslinker used in the practice of this invention, and typically the maximum amount of silane crosslinker does not exceed 5, preferably it does not exceed 2, wt % based on the weight of the copolymer.

The silane crosslinker is grafted to the polyolefin copolymer by any conventional method, typically in the presence of a free radical initiator e.g. peroxides and azo compounds, or by ionizing radiation, etc. Organic initiators are preferred, such as any of those described above, e.g., the peroxide and azo initiators. The amount of initiator can vary, but it is typically present in the amounts described above for the crosslinking of the polyolefin copolymer.

While any conventional method can be used to graft the silane crosslinker to the polyolefin copolymer, one preferred method is blending the two with the initiator in the first stage of a reactor extruder, such as a Buss kneader. The grafting conditions can vary, but the melt temperatures are typically between 160 and 260 C, preferably between 190 and 230 C, depending upon the residence time and the half life of the initiator.

In another embodiment of the invention, the polymeric material further comprises a graft polymer to enhance the adhesion to one or more glass cover sheets to the extent that these sheets are components of the electronic device module. While the graft polymer can be any graft polymer compatible with the polyolefin copolymer of the polymeric material and which does not significantly compromise the performance of the polyolefin copolymer as a component of the module, typically the graft polymer is a graft polyolefin polymer and more typically, a graft polyolefin copolymer that is of the same composition as the polyolefin copolymer of the polymeric material. This graft additive is typically made in situ simply by subjecting the polyolefin copolymer to grafting reagents and grafting conditions such that at least a portion of the polyolefin copolymer is grafted with the grafting material.

Any unsaturated organic compound containing at least one ethylenic unsaturation (e.g., at least one double bond), at least one carbonyl group (—C=O), and that will graft to a polymer, particularly a polyolefin polymer and more particularly to a polyolefin copolymer, can be used as the grafting material in this embodiment of the invention. Representative of compounds that contain at least one carbonyl group are the carboxylic acids, anhydrides, esters and their salts, both metallic and nonmetallic. Preferably, the organic compound contains ethylenic unsaturation conjugated with a carbonyl group. Representative compounds include maleic, fumaric, acrylic, methacrylic, itaconic, crotonic, ∀-methyl crotonic, and cinnamic acid and their anhydride, ester and salt derivatives, if any. Maleic anhydride is the preferred unsaturated organic compound containing at least one ethylenic unsaturation and at least one carbonyl group.

The unsaturated organic compound content of the graft polymer is at least about 0.01 wt %, and preferably at least about 0.05 wt %, based on the combined weight of the polymer and the organic compound. The maximum amount of unsaturated organic compound content can vary to convenience, but typically it does not exceed about 10 wt %, preferably it does not exceed about 5 wt %, and more preferably it does not exceed about 2 wt %.

The unsaturated organic compound can be grafted to the polymer by any known technique, such as those taught in U.S. Pat. Nos. 3,236,917 and 5,194,509. For example, in the '917 patent the polymer is introduced into a two-roll mixer and mixed at a temperature of 60 C. The unsaturated organic compound is then added along with a free radical initiator, such as, for example, benzoyl peroxide, and the components are mixed at 30 C until the grafting is completed. In the '509 patent, the procedure is similar except that the reaction temperature is higher, e.g., 210 to 300 C, and a free radical initiator is not used or is used at a reduced concentration.

An alternative and preferred method of grafting is taught in U.S. Pat. No. 4,950,541 by using a twin-screw devolatilizing extruder as the mixing apparatus. The polymer and unsaturated organic compound are mixed and reacted within the extruder at temperatures at which the reactants are molten and in the presence of a free radical initiator. Preferably, the unsaturated organic compound is injected into a zone maintained under pressure within the extruder.

The polymeric materials of this invention can comprise other additives as well. For example, such other additives include UV-stabilizers and processing stabilizers such as trivalent phosphorus compounds. The UV-stabilizers are useful in lowering the wavelength of electromagnetic radiation that can be absorbed by a PV module (e.g., to less than 360 nm), and include hindered phenols such as Cyasorb UV2908 and hindered amines such as Cyasorb UV 3529, Hostavin N30, Univil 4050, Univin 5050, Chimassorb UV 119, Chimassorb 944 LD, Tinuvin 622 LD and the like. The phosphorus compounds include phosphonites (PEPQ) and phosphites (Weston 399, TNPP, P-168 and Doverphos 9228). The amount of UV-stabilizer is typically from about 0.1 to 0.8%, and preferably from about 0.2 to 0.5%. The amount of processing stabilizer is typically from about 0.02 to 0.5%, and preferably from about 0.05 to 0.15%.

Still other additives include, but are not limited to, antioxidants (e.g., hindered phenolics (e.g., Irganox® 1010 made by Ciba Geigy Corp.), cling additives, e.g., PIB, anti-blocks, anti-slips, pigments and fillers (clear if transparency is important to the application). In-process additives, e.g. calcium stearate, water, etc., may also be used. These and other potential additives are used in the manner and amount as is commonly known in the art.

The polymeric materials of this invention are used to construct electronic device modules in the same manner and using the same amounts as the encapsulant materials known in the art, e.g., such as those taught in U.S. Pat. No. 6,586,271, US Patent Application Publication US2001/0045229 A1, WO 99/05206 and WO 99/04971. These materials can be used as "skins" for the electronic device, i.e., applied to one or both face surfaces of the device, or as an encapsulant in which the device is totally enclosed within the material. Typically, the polymeric material is applied to the device by one or more lamination techniques in which a layer of film formed from the polymeric material is applied first to one face surface of the device, and then to the other face surface of the device. In an alternative embodiment, the polymeric material can be extruded in molten form onto the device and allowed to congeal on the device. The polymeric materials of this invention exhibit good adhesion for the face surfaces of the device.

In one embodiment, the electronic device module comprises (i) at least one electronic device, typically a plurality of such devices arrayed in a linear or planar pattern, (ii) at least one glass cover sheet, typically a glass cover sheet over both face surfaces of the device, and (iii) at least one polymeric material. The polymeric material is typically disposed between the glass cover sheet and the device, and the polymeric material exhibits good adhesion to both the device and the sheet. If the device requires access to specific forms of electromagnetic radiation, e.g., sunlight, infrared, ultra-violet, etc., then the polymeric material exhibits good, typically excellent, transparency for that radiation, e.g., transmission rates in excess of 90, preferably in excess of 95 and even more preferably in excess of 97, percent as measured by UV-vis spectroscopy (measuring absorbance in the wavelength range of about 250-1200 nanometers. An alternative measure of transparency is the internal haze method of ASTM D-1003-00. If transparency is not a requirement for operation of the electronic device, then the polymeric material can contain opaque filler and/or pigment.

In FIG. 1, rigid PV module 10 comprises photovoltaic cell 11 surrounded or encapsulated by transparent protective layer or encapsulant 12 comprising a polyolefin copolymer used in the practice of this invention. Glass cover sheet 13 covers a front surface of the portion of the transparent protective layer disposed over PV cell 11. Backskin or back sheet 14, e.g., a second glass cover sheet or another substrate of any kind, supports a rear surface of the portion of transparent protective layer 12 disposed on a rear surface of PV cell 11. Backskin layer 14 need not be transparent if the surface of the PV cell to which it is opposed is not reactive to sunlight. In this embodiment, protective layer 12 encapsulates PV cell 11. The thicknesses of these layers, both in an absolute context and relative to one another, are not critical to this invention and as such, can vary widely depending upon the overall design and purpose of the module. Typical thicknesses for protective layer 12 are in the range of about 0.125 to about 2 millimeters (mm), and for the glass cover sheet and backskin layers in the range of about 0.125 to about 1.25 mm. The thickness of the electronic device can also vary widely.

Figure 2:
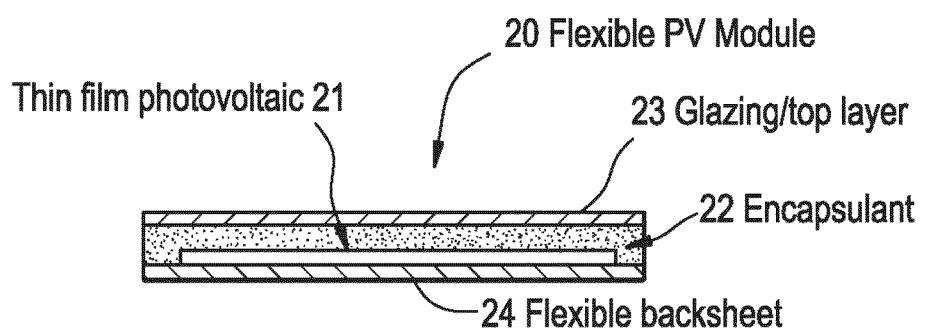
FIG. 2 is a schematic of another embodiment of an electronic device module of this invention, i.e., a flexible PV module.

In FIG. 2, flexible PV module 20 comprises thin film photovoltaic 21 over-lain by transparent protective layer or encapsulant 22 comprising a polyolefin copolymer used in the practice of this invention. Glazing/top layer 23 covers a front surface of the portion of the transparent protective layer disposed over thin film PV 21. Flexible backskin or back sheet 24, e.g., a second protective layer or another flexible substrate of any kind, supports the bottom surface of thin film PV 21. Backskin layer 24 need not be transparent if the surface of the thin film cell which it is supporting is not reactive to sunlight. In this embodiment, protective layer 21 does not encapsulate thin film PV 21. The overall thickness of a typical rigid or flexible PV cell module will typically be in the range of about 5 to about 50 mm.

The modules described in FIGS. 1 and 2 can be constructed by any number of different methods, typically a film or sheet co-extrusion method such as blown-film, modified blown-film, calendaring and casting. In one method and referring to FIG. 1, protective layer 14 is formed by first extruding a polyolefin copolymer over and onto the top surface of the PV cell and either simultaneously with or subsequent to the extrusion of this first extrusion, extruding the same, or different, polyolefin copolymer over and onto the back surface of the cell. Once the protective film is attached the PV cell, the glass cover sheet and backskin layer can be attached in any convenient manner, e.g., extrusion, lamination, etc., to the protective layer, with or without an adhesive. Either or both external surfaces, i.e., the surfaces opposite the surfaces in contact with the PV cell, of the protective layer can be embossed or otherwise treated to enhance adhesion to the glass and backskin layers. The module of FIG. 2 can be constructed in a similar manner, except that the backskin layer is attached to the PV cell directly, with or without an adhesive, either prior or subsequent to the attachment of the protective layer to the PV cell.

The following prophetic examples further illustrate the invention. Unless otherwise indicated, all parts and percentages are by weight.

SPECIFIC EMBODIMENTS

Example 1

A monolayer 15 mil thick protective film is made from a blend comprising 80 wt % of ENGAGE® 8400 polyethylene (ethylene/1-octene, 30 MI, 0.87 g/cc), 20 wt % of a maleic anhydride (MAH) modified ethylene/1-octene copolymer (ENGAGE® 8400 polyethylene grafted at a level of about 1 wt % MAH, and having a post-modified MI of about 1.25 g/10 min and a density of about 0.87 g/cc), 1.5 wt % of Lupersol® 101, 0.8 wt % of tri-allyl cyanurate, 0.1 wt % of Chimassorb® 944, 0.2 wt % of Naugard® P, and 0.3 wt % of Cyasorb® UV 531. The melt temperature during film formation is kept below about 120 C to avoid premature crosslinking of the film during extrusion. This film is then used to prepare a solar cell module. The film is laminated at a temperature of about 150 C to a superstrate, e.g., a glass cover sheet, and the front surface of a solar cell, and then to the back surface of the solar cell and a backskin material, e.g., another glass cover sheet or any other substrate. The protective film is then subjected to conditions that will ensure that the film is substantially crosslinked.

Example 2

The procedure of Example 1 is repeated except that the blend comprised 90 wt % ENGAGE® 8400 (ethylene/1-octene, 30 Mi, 0.87 g/cc) and 10 wt % of a maleic anhydride (MAH) modified ethylene/1-octene (ENGAGE® 8400 polyethylene grafted at a level of about 1 wt % MAH, and having a post-modified MI of about 1.25 g/10 min and a density of about 0.87 g/cc), and the melt temperature during film formation was kept below about 120° C. to avoid premature crosslinking of the film during extrusion.

Example 3

The procedure of Example 1 is repeated except that the blend comprised 97 wt % ENGAGE® 8400 (ethylene/1-octene, 30 Mi, 0.87 g/cc) and 3 wt % of vinyl silane (no maleic anhydride modified ENGAGE® 8400 polyethylene), and the melt temperature during film formation was kept below about 120° C. to avoid premature crosslinking of the film during extrusion.

Formulations and Processing Procedures:

Step 1: Use ZSK-30 extruder with Adhere Screw to compound resin and additive package with or without Amplify.

Step 2: Dry the material from Step 2 for 4 hours at 100 F maximum (use W&C canister dryers).

Step 3: With material hot from dryer, add melted DiCup+ Silane+TAC, tumble blend for 15 min and let soak for 4 hours.

TABLE 1

| Formulation | |
|---|---|
| Sample No. | 1 |
| Engage 8400 (ethylene/1-octene, 30 MI, 0.870 g/cc.) | 94.7 |
| 4-Hydroxy-TEMPO | 0.05 |
| Cyasorb UV 531 | 0.3 |
| Chimassorb 944 LD | 0.1 |
| Tinuvin 622 LD | 0.1 |
| Naugard P | 0.2 |
| Additives below added via soaking step | |
| Dicup-R Peroxide | 2 |
| Gamma-methacrylo-propyl-trimethoxysilane (Dow Corning Z-6030) | 1.75 |
| Sartomer SR-507 Tri-Allyl Cyanurate (TAC) | 0.8 |
| Total | 100 |

Test Methods and Results:

The adhesion with glass is measured using silane-treated glass. The procedure of glass treatment is adapted it from a procedure in Gelest, Inc. "Silanes and Silicones, Catalog 3000 A".

Approximately 10 mL of acetic acid is added to 200 mL of 95% ethanol in order to make the solution slightly acidic. Then, 4 mL of 3-aminopropyltrimethoxysilane is added with stirring, making a ~2% solution of silane. The solution sits for 5 minutes to allow for hydrolysis to begin, and then it is transferred to a glass dish. Each plate is immersed in the solution for 2 minutes with gentle agitation, removed, rinsed briefly with 95% ethanol to remove excess silane, and allowed to drain. The plates are cured in an oven at 110° C. for 15 minutes. Then, they are soaked in a 5% solution of sodium bicarbonate for 2 minutes in order to convert the acetate salt of the amine to the free amine. They are rinsed with water, wiped dry with a paper towel, and air dried at room temperature overnight.

The method for testing the adhesion strength between the polymer and glass is the 180 peel test. This is not an ASTM standard test, but it is used to examine the adhesion with glass for PV modules. The test sample is prepared by placing uncured film on the top of the glass, and then curing the film under pressure in a compression molding machine. The molded sample is held under laboratory conditions for two days before the test. The adhesion strength is measured with an Instron machine. The loading rate is 2 in/min, and the test is run under ambient conditions. The test is stopped after a stable peel region is observed (about 2 inches). The ratio of peel load over film width is reported as the adhesion strength.

Several important mechanical properties of the cured films are evaluated using tensile and dynamic mechanical analysis (DMA) methods. The tensile test is run under ambient conditions with a load rate of 2 in/min. The DMA method is conducted from −100 to 120 C.

The optical properties are determined as follows: Percent of light transmittance is measured by UV-vis spectroscopy. It measures the absorbance in the wavelength of 250 nm to 1200 nm. The internal haze is measured using ASTM D1003-61.

The results are reported in Table 2. The EVA is a fully formulated film available from Etimex.

TABLE 2

Test Results

| Key Properties | EVA | 1 |
|---|---|---|
| Elongation to break (%) | 411.7 | 528.7 |
| STDV* | 17.5 | 43.3 |
| Tensile strength at 85° C. (psi) | 51.2 | 118.4 |
| STDV* | 8.9 | 12.7 |
| Elongation to break at 85° C. (%) | 77.1 | 146.9 |
| STDV* | 16.3 | 24.7 |
| Adhesion with glass (N/mm) | 7 | 4.5 |
| % of transmittance | >97 | >97 |
| STDV* | 0.1 | 0.2 |
| Internal Haze | 2.8 | 7.2 |
| STDV* | 0.4 | 1 |

*STDV = Standard Deviation.

As shown by the data of Table 2, the polyolefin copolymer provided much superior elongation to break, tensile strength and elongation to break at 85 C as compared with the EVA polymer with little diminution in adhesion to glass strength and optics.

The adhesion with glass is measured using silane-treated glass. The procedure of glass treatment is adapted it from a procedure in Gelest, Inc. "Silanes and Silicones, Catalog 3000 A":

Approximately 10 mL of acetic acid is added to 200 mL of 95% ethanol in order to make the solution slightly acidic. Then, 4 mL of 3-aminopropyltrimethoxysilane is added with stirring, making a ~2% solution of silane. The solution sits for 5 minutes to allow for hydrolysis to begin, and then it is transferred to a glass dish. Each plate is immersed in the solution for 2 minutes with gentle agitation, removed, rinsed briefly with 95% ethanol to remove excess silane, and allowed to drain. The plates are cured in an oven at 110° C. for 15 minutes. Then, they are soaked in a 5% solution of sodium bicarbonate for 2 minutes in order to convert the acetate salt of the amine to the free amine. They are rinsed with water, wiped dry with a paper towel, and air dried at room temperature overnight.

The optical properties are determined as follows: Percent of light transmittance is measured by UV-vis spectroscopy. It measures the absorbance in the wavelength of 250 nm to 1200 nm. The internal haze is measured using ASTM D1003-61.

Example 4

Random Copolymer Polyethylene-Based Encapsulant Film

ENGAGE™ 8200 ethylene/1-octene random copolymer (made by The Dow Chemical Company) is used in this example. Its density is 0.87 g/cm³, the melt index is 5 g/10 minutes (measured based on standard ASTM D1238, condition 190 C/2.16 kg). There is 100 ppm of antioxidant, Irganox 1076, in the resin. Several additives are selected to add functionality or improve the long term stability of the resin. They are UV absorbent Cyasorb UV 531, UV-stabilizer Chimassorb 944 LD, antioxidant Tinuvin 622 LD, vinyltrimethoxysilane (VTMS), and peroxide Luperox-101. The formulation in weight percent is described in Table 3.

TABLE 3

Film Formulation

| Formulation | Weight Percent |
|---|---|
| ENGAGE 8200 | 97.34 |
| Cyasorb UV 531 | 0.3 |
| Chimassorb 944 LD | 0.1 |
| Tinuvin 622 LD | 0.1 |
| Irganox-168 | 0.08 |
| Silane (Dow Corning Z-6300) | 2 |
| Luperox-101 | 0.08 |
| Total | 100 |

Sample Preparation

ENGAGE 8200 pellets are dried at 40° C. for overnight in a dryer. The pellets and the additives are dry mixed and placed in a drum and tumbled for 30 minutes. Then the silane and peroxide are poured into the drum and tumbled for another 15 minutes. The well-mixed materials are fed to a film extruder for film casting.

Film is cast on a film line (single screw extruder, 24-inch width sheet die) and the processing conditions are summarized in Table 4.

TABLE 4

Process Conditions

| | | | | Extruder | | | Die | |
|---|---|---|---|---|---|---|---|---|
| Sample # | RPM | Amp | Head P (psi) | Zone 1 (F.) | Zone 2 (F.) | Zone 3 (F.) | Adapter (F.) | Adapter (C.) | Die (C.) |
| 1 | 25 | 22 | 2,940 | 300 | 325 | 350 | 350 | 182 | 140 |

An 18-19 mil thick film is saved at 5.3 feet per minute (ft/min). The film sample is sealed in an aluminum bag to avoid UV-irradiation and moisture.

Test Methods and Results

Figure 3:
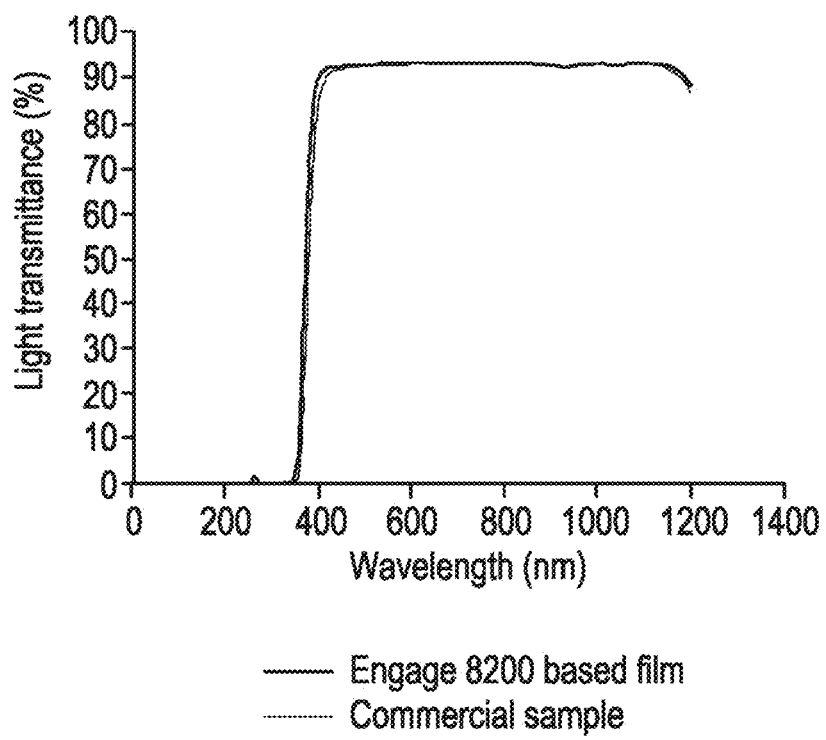
FIG. 3 is the UV spectrum of the experimental and commercial films report in Example 4.

1. Optical Property:

The light transmittance of the film is examined by UV-visible spectrometer (Perkin Elmer UV-Vis 950 with scanning double monochromator and integrating sphere accessory). Samples used for this analysis have a thickness of 15 mils. FIG. 3 shows the UV-visible spectra of the film and a comparison film, i.e., commercial incumbent film ETIMEX 485 which is made from ethylene vinyl acetate (about 33 wt % VA content) for the same application. Both films show above 90% of transmittance over the wavelength range from 400 to 1100 nm.

2. Adhesion to Glass:

The method used for the adhesion test is a 180° peel test. This is not an ASTM standard test, but has been used to examine the adhesion with glass for photovoltaic module and auto laminate glass applications. The test sample is prepared by placing the film on the top of glass under pressure in a compression molding machine. The desired adhesion width is 1.0 inch. The frame used to hold the sample is 5 inches by 5 inches. A Teflon™ sheet is placed between the glass and the material to separate the glass and polymer for the purpose of test setup. The conditions for the glass/film sample preparation are:

(1) 160° C. for 3 minutes at 80 pounds per square inch (psi) (2000 lbs)
(2) 160° C. for 30 minutes at 320 psi (8000 lbs)
(3) Cool to room temperature at 320 psi (8000 lbs)
(4) Remove the sample from the chase and allow 48 hours for the material to condition at room temperature before the adhesion test.

The adhesion strength is measured with a materials testing system (Instron 5581). The loading rate is 2 inches/minutes and the tests are run at ambient conditions (24° C. and 50% RH). A stable peel region is needed (about 2 inches) to evaluate the adhesion to glass. The ratio of peel load in the stable peel region over the film width is reported as the adhesion strength.

The effect of temperature and moisture on adhesion strength is examined using samples aged in hot water (80° C.) for one week. These samples are molded on glass, then immersed in hot water for one week. These samples are then dried under laboratory conditions for two days before the adhesion test. In comparison, the adhesion strength of the same commercial EVA film as described above is also evaluated under the same conditions. The adhesion strength of the experimental film and the commercial sample are shown in Table 5.

TABLE 5

Tests Results of Adhesion to Glass

| Sample Information | Conditions for Molding on Glass | Aging Condition | Adhesion Strength (N/mm) |
|---|---|---|---|
| Commercial Film (cured) | 160° C., one hr | none | 10 |
| Commercial Film (cured) | 160° C., one hr | 80° C. in water for one week | 1 |
| Inventive Film | 160° C., 30 min | none | >10 (no delamination)* |
| Inventive Film | 160° C., 30 min | 80° C. in water for one week | 3 |

*The sample did not delaminate, but instead began to destroy the film itself.

3. Water Vapor Transmission Rate (WVTR):

The water vapor transmission rate is measured using a permeation analysis instrument (Mocon Permatran W Model 101 K). All WVTR units are in grams per square meter per day (g/(m$^2$-day) measured at 38 C and 50 C and 100% RH, an average of two specimens. The commercial EVA film as described above is also tested to compare the moisture barrier properties. The inventive film and the commercial film thickness are 15 mils, and both films are cured at 160° C. for 30 minutes. The results of WVTR testing are reported in Table 6.

TABLE 6

Summary of WVTR Test Results

| Film | Specimen | WVTR at 38 C. g/(m$^2$-day) | WVTR at 50 C. g/(m$^2$-day) | Thick (mil) mil | Permeation at 38 C. (g-mil)/ (m$^2$-day) | Permeation at 50 C. (g-mil)/ (m$^2$-day) |
|---|---|---|---|---|---|---|
| Commercial Film | A | 44.52 | 98.74 | 16.80 | 737 | 1660 |
| | B | 44.54 | 99.14 | 16.60 | 749 | 1641 |
| | avg. | 44.53 | 98.94 | 16.70 | 743 | 1650 |
| Inventive Film | A | 5.62 | 14.08 | 18.90 | 102 | 266 |
| | B | 5.53 | 14.07 | 18.20 | 104 | 256 |
| | avg. | 5.57 | 14.07 | 18.55 | 103 | 261 |

Example 5

Two resins are used to prepare a three-layer A-B-A, co-extruded film for encapsulating an electronic device. The total thickness of the film is 18 mil. The outer A layers contact the surfaces of the die. The core (B) layer comprises 80 volume percent (vol %) of the sheet, and each outer layer comprises 10 vol % of the sheet. The composition of the A layers does not require drying. The composition of the core layer, i.e., the B layer, comprises the same components and is prepared in the same manner as the composition described in Example 3. In the skin layers, ENGAGE™ 8400 resin is replaced with a blend of (i) polyolefin polymer having a melt index (MI) of 5 and a density of 0.868 g/cc, and (ii) AMPLIFY GR 216 resin (a MAH-modified ethylene/1-octene resin grafted at a level of about 1 wt % MAH, and having a post-modified MI of about 1.25 g/10 min and a density of about 0.87 g/cc. Both compositions are reported in Table 7.

TABLE 7

Compositions of the Layers of an A-B-A Layer Film

| Component | Outer Layers (wt %) | Core Layer (wt %) |
|---|---|---|
| ENGAGE 8400 | 0 | 94.7 |
| Polyolefin Resin | 20 | 0 |
| AMPLIFY™ GR-216O | 79.3 | 0 |
| TEMPO | 0 | 0.05 |
| Cyasorb UV 531 | 0.3 | 0.3 |
| Chimassorb 944 LD | 0.1 | 0.1 |
| Tinuvin 622 LD | 0.1 | 0.1 |
| Naugard P | 0.2 | 0.2 |
| Dicup-R | 0 | 2.0 |
| Trimethoxysilane | 0 | 1.75 |
| Sartomer SR-507 | 0 | 0.8 |

The A-B-A film is co-extruded onto an electronic device, and the film exhibits improved optical properties in terms of percent transmittance and internal haze relative to a monolayer of either composition.

Example 6

Two set of samples are prepared to demonstrate that UV absorption can be shifted by using different UV-stabilizers. Engage 8100 polyolefin elastomer (density 0.87 g/cc, melt index 1), are used and Table 8 reports the formulations with different UV-stabilizers (all amounts are in weight percent). The samples are made using a mixer at a temperature of 190° C. for 5 minutes. Thin films with a thickness of 16 mils are made using a compressing molding machine. The molding conditions are 10 minutes at 160° C., and then cooling to 24° C. in 30 minutes. The UV spectrum is measured using a UV/Vis spectrometer such as a Lambda 950. The UV spectrums of these films are shown in FIG. 4. The results show that different types (and/or combinations) of UV-stabilizers can allow the absorption of UV radiation at a wavelength below 360 nm.

TABLE 8

ENGAGE 8100 with Different UV-Stabilizers

| Sample | ENGAGE 8100 | Absorber UV-531 | Cyasorb UV2908 | Cyasorb UV3529 | Chimassorb UV-119 | Chimassorb 944-LD | Tinuvin 622-LD |
|---|---|---|---|---|---|---|---|
| 1 | 100 | | | | | | |
| 2 | 99.7 | 0.3 | | | | | |
| 3 | 99.7 | | 0.3 | | | | |
| 4 | 99.7 | | | 0.3 | | | |
| 5 | 99.7 | | | | 0.3 | | |
| 6 | 99.5 | | | | | 0.25 | 0.25 |
| 7 | 99.85 | 0.15 | | | | | |

Another set of samples are prepared to examine UV-stability. Again, a polyolefin elastomer, Engage 8100 (density 0.87 g/cc, melt index 1) is selected for this study. Table 9 reports the formulations designed for encapsulant polymers for photovoltaic modules with different UV-stabilizers, silane and peroxide, and antioxidant. These formulations are designed to lower the UV absorbance and at the same time maintain and improved the long term UV-stability.

TABLE 9

ENGAGE 8100 with Different UV-Stabilizers, Silanes, Peroxides and Antioxidants

| Samples | Engage 8100 | Absorber UV 531 | Cyasorb UV 2908 | Cyasorb UV 3529 | Univil 4050 | Doverphos S-9228 | Hostavin N30 | Chimassorb UV 119 | Chimassorb 944 LD | Tinuvin 622 LD | Western 399 | Irgafos 166 |
|---|---|---|---|---|---|---|---|---|---|---|---|---|
| C1 | 99.8 | | | | | | | | | | 0.2 | |
| C2 | 99.3 | 0.3 | | | | | | | 0.1 | 0.1 | 0.2 | |
| C3 | 99.5 | 0.3 | | | | | | | 0.1 | 0.1 | | |
| 1 | 99.5 | | 0.5 | | | | | | | | | |
| 2 | 99.5 | | | 0.5 | | | | | | | | |
| 3 | 99.5 | | | | | | | 0.5 | | | | |
| 4 | 99.5 | | | | | | | | 0.5 | | | |
| 5 | 99.7 | | | 0.3 | | | | | | 0.5 | | |
| 6 | 99.3 | | | 0.7 | | | | | | | | |
| 7 | 99.5 | | | | 0.5 | | | | | | | |
| 8 | 99.5 | | | | | | | 0.5 | | | | |
| 9 | 99.4 | 0.3 | | | | 0.1 | | | 0.1 | 0.1 | | |
| 10 | 99.3 | 0.3 | | | | | | | 0.1 | 0.1 | | 0.2 |
| 11 | 99.3 | | | 0.5 | | | | | | | | 0.2 |

Although the invention has been described in considerable detail through the preceding description and examples, this detail is for the purpose of illustration and is not to be construed as a limitation on the scope of the invention as it is described in the claims. All United States patents, published patent applications and allowed patent applications identified above are incorporated herein by reference.

What is claimed is:

1. An electronic device module comprising:
   A. At least one electronic device, and
   B. An encapsulant film having a thickness in the range of from 0.125 to about 1.25 mm, said encapsulant film comprising a polymeric material in intimate contact with at least one surface of the at least one electronic device, the polymeric material comprising a reaction product of at least
   (1) a polyolefin copolymer with (a) a density of less than about 0.90 g/cc, (b) a melt point of less than about 95 C, (c) a 2% secant modulus of less than about 150 mega-Pascal (mPa) as measured by ASTM D-882-02, (d) an α-olefin content of at least about 15 and less than about 50 wt% based on the weight of the polymer, (e) a Tg of less than about −35C, and (f) a CDBI of at least about 50%,
   (2) a vinyl silane in an amount of at least about 0.1 wt% based on the weight of the copolymer; and optionally
   (3), a co-agent, wherein the co-agent, if present, is present in an amount less than 3% by weight of the polyolefin copolymer
   wherein the polymeric material has a percent optical transmission of at least 30% at 340 nanometers.

2. The module of claim 1 in which the at least one electronic device is a solar cell.

3. The module of claim 1 in which the reaction product further comprises a free radical initiator.

4. The module of claim 3 where the free radical initiator is a peroxide.

5. The module of claim 1 in which the vinyl silane is at least one of vinyl tri-ethoxy silane and vinyl tri-methoxy silane.

6. The module of claim 1 in which the polyolefin copolymer is crosslinked such that that the copolymer contains less than about 70 percent xylene soluble extractables as measured by ASTM 2765-95.

7. The module of claim 1 in which the polymeric material is in the form of a monolayer film in intimate contact with at least one surface of the at least one electronic device.

8. The module of claim 1 in which the polymeric material further comprises a scorch inhibitor in an amount from about 0.01 to about 1.7 wt%.

9. The module of claim 1 further comprising at least one glass cover sheet.

10. The module of claim 1 in which the polyolefin copolymer is grafted with an unsaturated organic compound containing at least one ethylenic unsaturation and at least one carbonyl group.

11. The module of claim 10 in which the unsaturated organic compound is maleic anhydride.

12. The module of claim 1 in which the polyolefin copolymer is a homogeneously branched, linear ethylene/α-olefin copolymer or a homogeneously branched, substantially linear ethylene/α-olefin copolymer.

13. The electronic device module of claim 1 in which the polymeric material is a co-extruded material in which at least one outer skin layer (i) does not contain peroxide for crosslinking, and (ii) is the surface which comes into intimate contact with the module.

14. The electronic device module of claim 13 in which the co-extruded material comprises at least three layers.

15. The electronic device module of claim 14 in which a core layer contains peroxide.

16. A method of making the electronic device module of claim 1 comprising extruding or laminating the polymeric material onto at least one surface of the at least one electronic device characterized in that the copolymer is not cured or crosslinked until contact with the at least one electronic device.

17. The module of claim 1 in which the vinyl silane is present in an amount of at least 0.5 weight percent.

18. The module of claim 1 in which the vinyl silane is present in an amount of at least 0.7 weight percent.

\* \* \* \* \*